US009681578B2

(12) United States Patent
Xiang et al.

(10) Patent No.: US 9,681,578 B2
(45) Date of Patent: Jun. 13, 2017

(54) HEAT DISSIPATION SYSTEM AND COMMUNICATIONS DEVICE

(71) Applicant: Huawei Technologies Co., Ltd., Shenzhen (CN)

(72) Inventors: Nengwu Xiang, Shenzhen (CN); Changyi Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/788,063

(22) Filed: Jun. 30, 2015

(65) Prior Publication Data

US 2015/0305194 A1    Oct. 22, 2015

Related U.S. Application Data

(63) Continuation of application No. PCT/CN2012/088076, filed on Dec. 31, 2012.

(51) Int. Cl.
*H05K 7/20* (2006.01)
*H05K 7/14* (2006.01)

(52) U.S. Cl.
CPC ....... *H05K 7/20136* (2013.01); *H05K 7/1439* (2013.01); *H05K 7/1447* (2013.01); *H05K 7/20572* (2013.01)

(58) Field of Classification Search
CPC .. H05K 7/1447; H05K 7/1448; H05K 7/1449; H05K 7/20136; H05K 7/20545; H05K 7/20563; H05K 7/20572; H05K 7/20727; H05K 7/20736; H05K 2201/044
USPC .............. 361/679.48, 694, 695, 785, 788
See application file for complete search history.

(56) References Cited

U.S. PATENT DOCUMENTS

| 5,813,243 A * | 9/1998 | Johnson ................... G06F 1/20 |
| | | 361/678 |
| 8,630,087 B1 * | 1/2014 | Reynov .............. H05K 7/20563 |
| | | 361/679.5 |
| 2013/0107489 A1 | 5/2013 | Wen et al. |

(Continued)

FOREIGN PATENT DOCUMENTS

| CN | 101287344 A | 10/2008 |
| CN | 101340296 A | 1/2009 |
| CN | 101984599 A | 3/2011 |

(Continued)

*Primary Examiner* — Tuan T Dinh
*Assistant Examiner* — Mukund G Patel
(74) *Attorney, Agent, or Firm* — Leydig, Voit & Mayer, Ltd.

(57) ABSTRACT

A heat dissipation system used for a communications device is disclosed, where the communications device includes a chassis, a network board, a service board, a backplane, and a high-rate cable; the chassis is configured to house the network board, the service board, the backplane, and the high-rate cable; the backplane is vertically inserted in a middle part or a middle rear part of the chassis, and parallel to a front side of the chassis; the service board and the network board are parallel and are connected to a front side of the backplane; the high-rate cable is connected between the network board and the service board on a rear side of the backplane; and the heat dissipation system further includes multiple fans that are installed in an array form on a rear side of the chassis, and an air vent that penetrates through the backplane.

16 Claims, 9 Drawing Sheets

(56) References Cited

U.S. PATENT DOCUMENTS

2014/0002988 A1* 1/2014 Roesner .................. G06F 1/20
　　　　　　　　　　　　　　　　　　　　　　361/679.49
2014/0071618 A1 3/2014 Tian et al.

FOREIGN PATENT DOCUMENTS

| CN | 102436298 A | 5/2012 |
| DE | 202008003388 U1 | 6/2008 |
| KR | 20040061115 A | 7/2004 |

* cited by examiner

10

HEAT DISSIPATION SYSTEM AND COMMUNICATIONS DEVICE

CROSS-REFERENCE TO RELATED APPLICATIONS

This application is a continuation of International Patent Application No. PCT/CN2012/088076, filed on Dec. 31, 2012, which is hereby incorporated by reference in its entirety.

TECHNICAL FIELD

Embodiments of the present disclosure relate to a heat dissipation system and communications device.

BACKGROUND

With the advent of broadband networks and a mass data era, there is an increasing demand for high-bandwidth transmission, high density, and high-performance computing, and the following requirements are raised for design of a communications device system: (1) A higher bandwidth inside the device system is required, along with a capability of sustainable evolution of the high bandwidth; (2) the device system is required to have higher integration and a highly-efficient heat dissipation capability, that is, competitiveness of the system is reflected in the evolution of the high bandwidth and system integration.

For a communications device system with a shelf or cabinet structure, a PCB (Printed Circuit Board, printed circuit board) backplane is used inside the conventional device system, and a bottom-to-top straight air duct or a Z-shaped air duct is used as a heat dissipation manner of the system. Therefore, the system encounters a bottleneck in terms of high-bandwidth development and system integration improvement. A conventional high-rate PCB backplane is subject to various constraints, such as the number of backplane layers, a backplane thickness, a backplane size, backplane material quality, and backplane costs, and therefore cannot support a high-density and high-rate wiring requirement. In addition, constraints also exist in such aspects as a rate of an electrical signal and a transmission distance. For example, after a rate of a high-rate signal exceeds 10 Gbit/s, it is already quite difficult to interconnect high-rate cables on a large-sized backplane, and the problem is even more severe at 25 Gbit/s or a higher rate.

In a conventional device system solution, in terms of a cooling air duct, independent air duct space is required for the bottom-top straight air duct to evolve to the Z-shaped air duct. This reduces system space utilization and system integration, and cooling air passes a turning part of a "Z" channel, which increases wind resistance, lowers wind speed, and causes slightly low heat dissipation efficiency of the system.

SUMMARY

An embodiment of the present disclosure provides a heat dissipation solution: while a system bandwidth is improved through a high-rate cable, utilization of space inside a chassis is comprehensively improved and an overall heat dissipation capability of the communications device is improved by properly designing a wiring manner of the high-rate cable and a layout relationship between the high-speed cable and a fan.

In a aspect, an embodiment of the present disclosure provides a heat dissipation system used for a communications device, where the communications device includes a chassis, a network board, a service board, a backplane, and a high-rate cable; the chassis is configured to house the network board, the service board, the backplane, and the high-rate cable; the backplane is vertically inserted in a middle part or a middle rear part of the chassis, and parallel to a front side of the chassis; the service board and the network board are parallel and are connected to a front side of the backplane; the high-rate cable is connected between the network board and the service board on a rear side of the backplane; and the heat dissipation system further includes multiple fans that are installed in an array form on a rear side of the chassis, and an air vent that penetrates through the backplane.

In another aspect, an embodiment of the present disclosure provides a communications device, wherein the communications device comprises a chassis, a network board, a service board, a backplane, a high-rate cable and a heat dissipation system; the chassis is configured to house the network board, the service board, the backplane, and the high-rate cable; the backplane is vertically inserted in a middle part or a middle rear part of the chassis, and parallel to a front side of the chassis; the service board and the network board are parallel and are connected to a front side of the backplane; the high-rate cable is connected between the network board and the service board on a rear side of the backplane; and wherein the heat dissipation system comprises multiple fans that are installed in an array form on a rear side of the chassis, and an air vent that penetrates through the backplane.

According to the embodiments of the present disclosure, space used for wiring a high-rate cable is formed through specially designed fan layout, which on one hand improves utilization of space inside a communications device chassis, and on the other hand improves heat dissipation efficiency of a communications device.

BRIEF DESCRIPTION OF DRAWINGS

To describe the technical solutions in the embodiments of the present disclosure more clearly, the following briefly introduces accompanying drawings required for describing the embodiments or the prior art. Apparently, the accompanying drawings in the following description show merely some embodiments of the present disclosure, and a person of ordinary skill in the art may still derive other drawings according to these accompanying drawings without creative efforts.

FIG. 1C is a sectional view of a section A-A shown in FIG. 1A;

FIG. 2C is a sectional view of a section A-A shown in FIG. 2A;

FIG. 3C is a sectional view of a section A-A shown in FIG. 3A;

FIG. 4C is a sectional view of a section A-A shown in FIG. 4A;

FIG. 5C is a sectional view of a section A-A shown in FIG. 5A;

FIG. 6C is a sectional view of a section A-A shown in FIG. 6A.

Figure 1A:
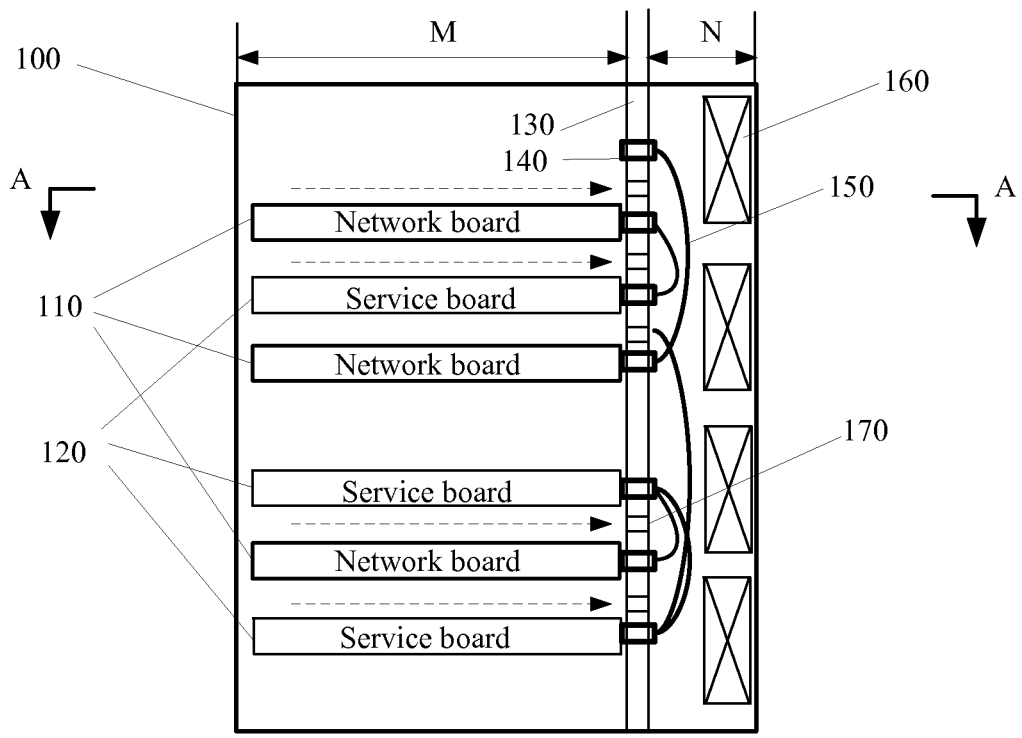
FIG. 1A is a schematic side sectional view of a communications device in a first example according to an embodiment of the present disclosure.

In the accompanying drawings in the embodiments of the present disclosure, a similar accompanying drawing sign represents a similar component.

DESCRIPTION OF EMBODIMENTS

The following clearly and describes the technical solutions in the embodiments of the present disclosure with reference to the accompanying drawings in the embodiments of the present disclosure. Apparently, the embodiments to be described are merely a part rather than all of the embodiments of the present disclosure. All other embodiments obtained by a person of ordinary skill in the art based on the embodiments of the present disclosure without creative efforts shall fall within the protection scope of the present disclosure.

Generally, a communications device, such as a network server, may include a chassis, a network board, a service board, a backplane, and a cable, where the chassis is roughly a cuboid and configured to house the network board, the service board, the backplane, and the cable. The chassis generally includes a left wall panel, a right wall panel, a top panel, a bottom panel, and a rear wall panel. A front wall panel may also be provided, depending on a specific requirement. The top panel and the bottom panel are basically vertically connected to or formed into a whole with the left wall panel and the right wall panel. The rear wall panel is connected to the left wall panel, the right wall panel, the top panel, and the bottom panel by using fasteners. The chassis formed in this way provides installation space and structural support for components in the chassis, such as the network board, the service board, the backplane, and the cable. In the communications device such as the network server, the backplane is configured to connect the network board and the service board, and is generally vertically inserted in the chassis and roughly located in a middle part or a middle rear part of the chassis. Connection slots or connection ports are installed on the backplane. The network board and the service board are connected to the backplane through the connection slots or connectors. Conventionally, the network board and the service board are inserted from a front side of the chassis, and connected to a front side of the backplane, whereas the cable is led out from a rear side of the backplane to implement interconnection between the network board and the service board. Here the network board generally refers to a central switching unit in a system, and is configured to implement data exchange between service boards, whereas the service board generally refers to another board other than a switching board in the system, and is mainly configured to perform service processing or interface processing. In the embodiments of the present disclosure, the network board and the service board are functionally differentiated only for ease of description, but not intended to limit their physical properties such as a structure and a shape. A person skilled in the art should understand that in a high-bandwidth transmission application scenario, the cable needs to be a high-rate cable and such a high-rate cable requires relatively large installation space; additionally, the system requires a proper cooling duct and a high-performance fan to meet a high-density heat dissipation requirement of the network board and the service board.

According to the embodiments of the present disclosure, in order to dissipate heat of the communications device, a heat dissipation system is provided in the communications device. The heat dissipation system includes multiple fans and an air vent that penetrates through the backplane, where the multiple fans are installed in an array form on a rear side of the chassis, and more specifically, installed on the rear wall panel of the chassis.

In the embodiments of the present disclosure, the term "rear side" is used in this specification to represent a side close to the rear wall panel, whereas the term "front side" is used to represent a side opposite to the "rear side" in this specification; the term "horizontal" is used in this specification to represent a direction parallel to a placement plane when the chassis is placed on the plane, whereas the term "vertical" is used in this specification to represent a direction vertical to the placement plane; the term "top" in this specification refers to a side far away from the placement plane of the chassis in a vertical direction, whereas the term "bottom" in this specification refers to a side close to the placement plane of the chassis; the term "left side" in this specification refers to a left side when facing the rear wall panel of the chassis placed on the plane, whereas the term "right side" in this specification refers to a right side in this case; the term "parallel" is used in this specification to indicate that two components are roughly parallel, which does not mean that the two are absolutely parallel, and a certain error may exist between the two or a certain angle may be formed between the two as long as a certain spacing exists between the two; and, the term "vertical" is used in this specification to indicate that two components are basically vertical to each other, which does not mean that the two absolutely intersect with each other at an angle of 90 degrees, and a certain reasonable error may exist between the two.

The following makes a specific description with reference to several specific examples of the embodiments of the present disclosure.

FIG. 1A is a schematic side sectional view of a communications device in a first example according to an embodiment of the present disclosure. As shown in FIG. 1A, a communications device 10 includes a chassis 100, a network board 110, a service board 120, a backplane 130, and a high-rate cable 150, where the chassis 100 is configured to house the network board 110, the service board 120, the backplane 130, and the high-rate cable 150. The backplane 130 is vertically inserted in a middle rear part of the chassis 100, and parallel to a front side of the chassis 100. The service board 120 and the network board 110 are parallel and are connected to a front side of the backplane 130. For example, the service board 120 and the network board 110 are inserted in connection slots 140, where the connection slots 140 are fixed on the backplane 130. A person skilled in the art should understand that a front side of a connection slot 140 may be connected to the service board 120 or the network board 110, whereas a rear side of the connection slot 140 may be connected to a cable, such as the high-rate cable 150. The high-rate cable 150 is connected between the network board 110 and the service board 120 on a rear side of the backplane 130. Depending on a requirement, the high-rate cable 150 may also be connected between the network boards 110 or connected between the service boards 120 on the rear side of the backplane 130.

Figure 1B:
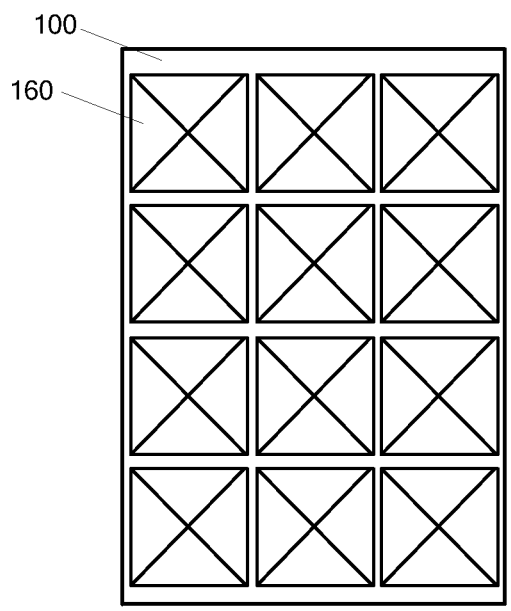
FIG. 1B is a schematic rear sectional view of the communications device in the first example according to an embodiment of the present disclosure.

FIG. 1B is a schematic rear sectional view of the communications device in the first example according to an embodiment of the present disclosure. With reference to FIG. 1A and FIG. 1B, the communications device 10 further includes a heat dissipation system, where the heat dissipation system includes multiple fans 160 that are installed in an array form on a rear side of the chassis 100, and an air vent 170 that penetrates through the backplane 130. The air vent 170 is close to a surface of the network board 110 or a surface of the service board 120, and is provided at a position which is on the backplane 130 and is directly opposite to a fan 160, so that under an effect of the fan 160, a cooling air flow (indicated by an arrow in FIG. 1A) passes through electronic components on the surface of the network board 110 or on the surface of the service board 120 from the front side of the chassis 100, cools the electronic components, and is then discharged out of the chassis 100 by the fan 160 through the air vent 170. As shown in FIG. 1A, in the embodiment of the present disclosure, M indicates space available for installing the network board 110 and the service board, where the space is inside the chassis 100 and located on the front side of the backplane 130; and N indicates space for installing the fan 160 and wiring the high-rate cable 150, where the space is inside the chassis 100 and located on the rear side of the backplane 130.

Figure 1C:
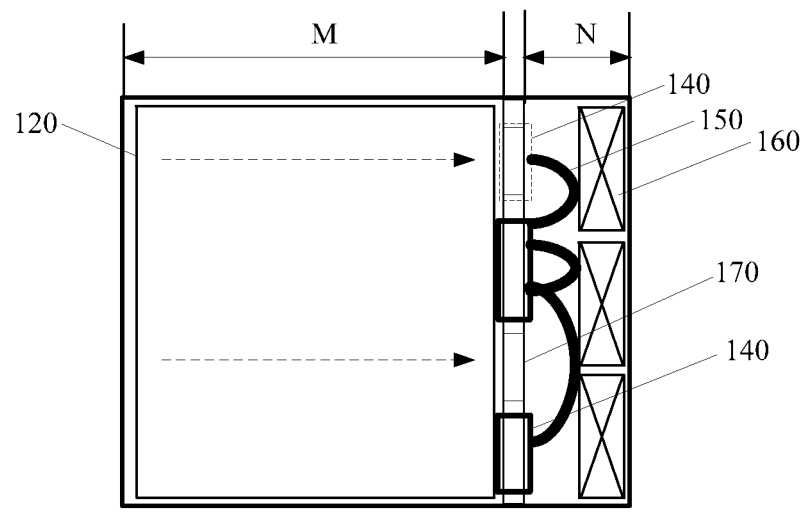
FIG. 1C is a schematic top view of the communications device in the first example according to an embodiment of the present disclosure.

FIG. 1C is a schematic top view of the communications device in the first example according to an embodiment of the present disclosure, and FIG. 1C is a sectional view of a section A-A shown in FIG. 1A. As shown in FIG. 1C, the high-rate cable 150 is connected between the connection slots 140 of the network boards 110 on a front side of the fan 160, and connected between a connection slot 140 of a network board 110 and a not-indicated connection slot 140 of another network board 110 or a service board 120. In FIG. 1C, dashed lines are used to show the not-indicated connection slot 140 of the other network board 110 or the service board 120.

As can be seen from FIG. 1A and FIG. 1C, in the space N, the smaller a thickness of the fan 160, the greater the space available for wiring the high-rate cable 150. A size of the wiring space, however, may directly affect layout of the high-rate cable 150 and a heat dissipation effect of the system. According to this example, quite many fans 160 can be installed on the rear side of the chassis 100 to help improve a heat dissipation effect of the entire communications device 10.

Figure 2A:
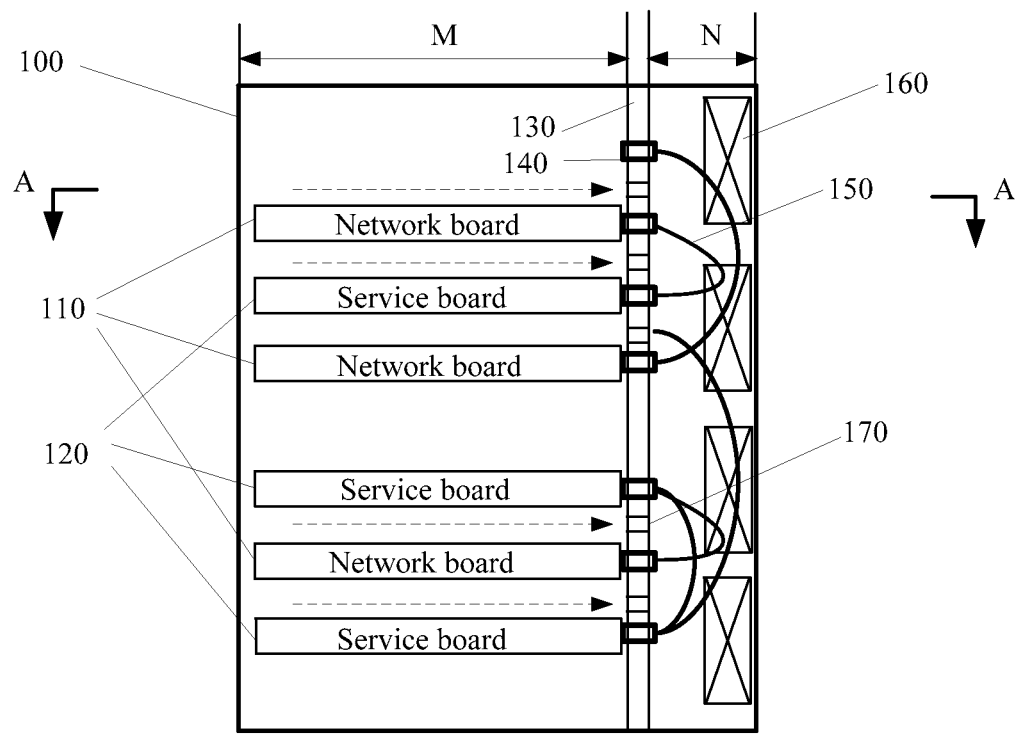
FIG. 2A is a schematic side sectional view of a communications device in a second example according to an embodiment of the present disclosure.
Figure 2B:
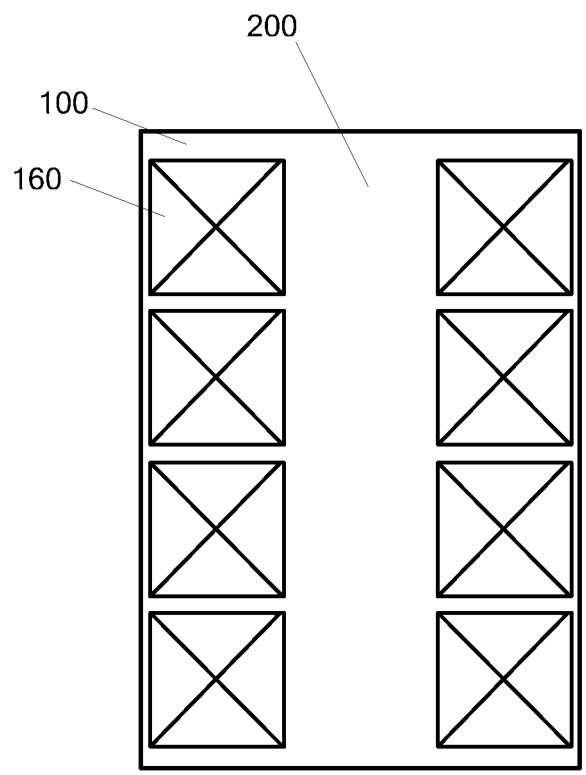
FIG. 2B is a schematic rear sectional view of the communications device in the second example according to an embodiment of the present disclosure.
Figure 2C:
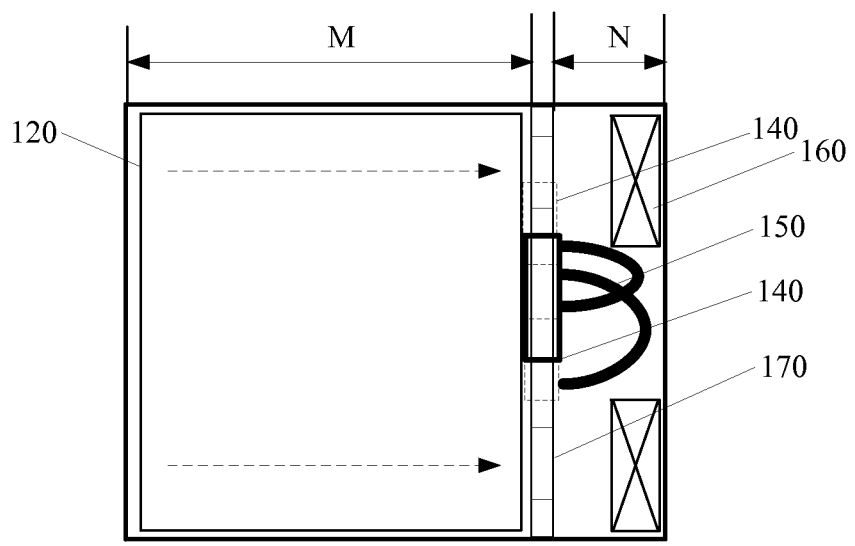
FIG. 2C is a schematic top view of the communications device in the second example according to an embodiment of the present disclosure.

The following further describes in detail an improved solution according to an embodiment of the present disclosure with reference to FIG. 2A to FIG. 2C.

FIG. 2A is a schematic side sectional view of a communications device in a second example according to an embodiment of the present disclosure. FIG. 2B is a schematic rear sectional view of the communications device in the second example according to an embodiment of the present disclosure. FIG. 2C is a schematic top view of the communications device in the second example according to an embodiment of the present disclosure, and FIG. 2C is a sectional view of a section A-A shown in FIG. 2A. As shown in FIG. 2A, a communications device 10 includes a chassis 100, a network board 110, a service board 120, a backplane 130, and a high-rate cable 150, where the chassis 100 is configured to house the network board 110, the service board 120, the backplane 130, and the high-rate cable 150.

The second example differs from the first example in that: a first gap 200 is formed along a vertical direction between multiple fans 160 in an array form, as shown in FIG. 2B, and the high-rate cable 150 connected between the network board 110 and the service board 120 passes through the first gap 200, as shown in FIG. 2C. For example, the multiple fans 160 are installed in a form of two columns of fans 160, and the first gap 200 is provided between the two columns of fans 160. In the second example, as shown in FIG. 2C, a position of an air vent 170 on the backplane 130 may be changed accordingly. For example, the air vent 170 is provided at a position which corresponds to a fan 160, such as directly opposite to the fan 160, so as to improve cooling efficiency. A connection slot 140 of the network board 110 may be installed at a position which is on the backplane 130 and corresponds to the first gap 200, so as to facilitate wiring of the high-rate cable 150, through the first gap 200, between the connection slot 140 of the network board 110 and a connection slot 140 (indicated by dashed lines in FIG. 2C) of the service board 120 or another network board 110. In the solution represented in the second example, because the high-rate cable 150 can pass through the first gap 200 between the fans 160, there is relatively sufficient wiring space for the high-rate cable 150, thereby improving density and capacity of wiring between the service board and the network board. In addition, because there is no obstacle in an air duct between the air vent 170 and a fan, a heat dissipation effect of the system is improved. Here, it should be noted that the second example is only exemplary description, and a person skilled in the art can, according to a specific requirement, for example, arrange the fans in a form of three columns, with the first gap 200 formed between two adjacent columns of fans among the three columns of fans, or arrange the fans in more columns, with the first gap 200 formed between two adjacent columns of fans among the provided columns of fans.

Figure 3A:
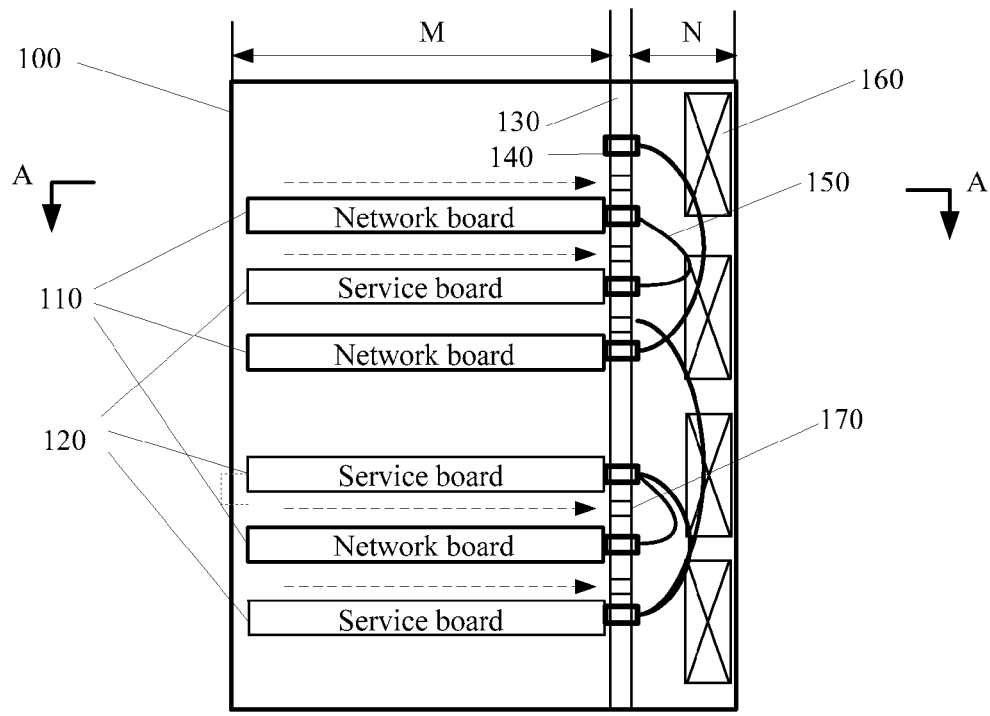
FIG. 3A is a schematic side sectional view of a communications device in a third example according to an embodiment of the present disclosure.
Figure 3B:
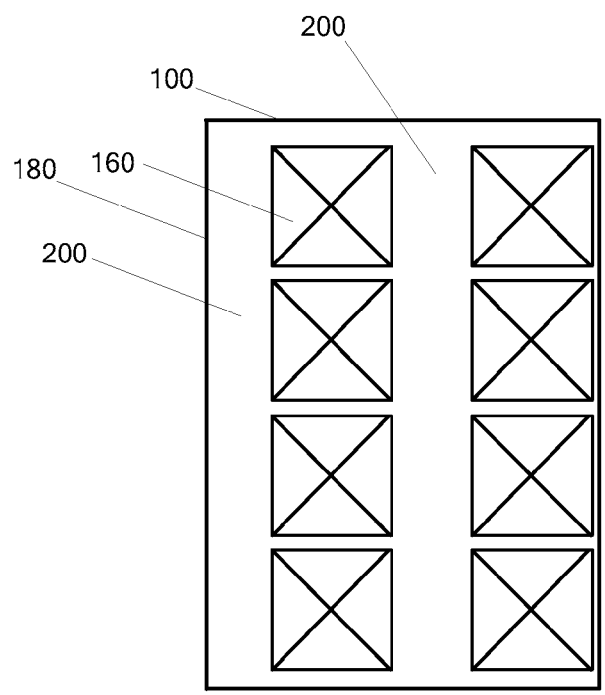
FIG. 3B is a schematic rear sectional view of the communications device in the third example according to an embodiment of the present disclosure.
Figure 3C:
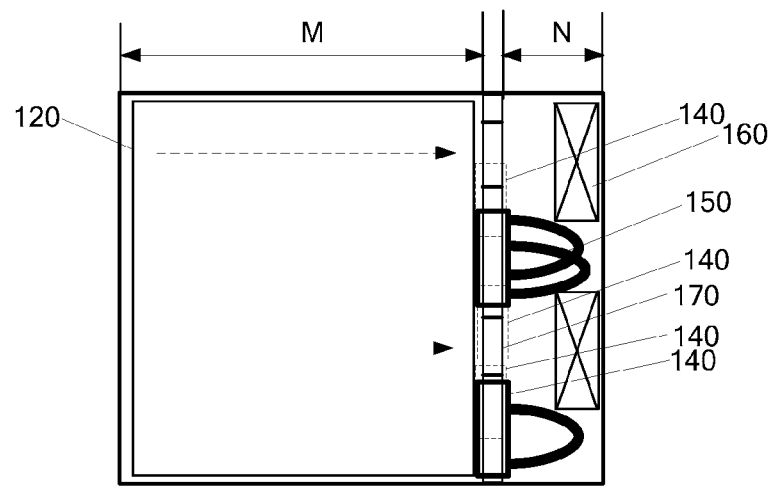
FIG. 3C is a schematic top view of the communications device in the third example according to an embodiment of the present disclosure.

The following further describes in detail an improved solution according to an embodiment of the present disclosure with reference to FIG. 3A to FIG. 3C.

FIG. 3A is a schematic side sectional view of a communications device in a third example according to an embodiment of the present disclosure. FIG. 3B is a schematic rear sectional view of the communications device in the third example according to an embodiment of the present disclosure. FIG. 3C is a schematic top view of the communications device in the third example according to an embodiment of the present disclosure, and FIG. 3C is a sectional view of a section A-A shown in FIG. 3A.

The third example is an alternative solution of the second example. As shown in FIG. 3A, a communications device 10 in the third example includes a chassis 100, a network board 110, a service board 120, a backplane 130, and a high-rate cable 150, where the chassis 100 is configured to house the network board 110, the service board 120, the backplane 130, and the high-rate cable 150. The third example differs from the second example in that: the first gap 200 may be provided between columns of fans 160 and a side wall panel 180 of the chassis 100, as shown in FIG. 3B and FIG. 3C. For example, the fans 160 are installed in a form of two columns of fans 160, and the first gap 200 is provided between the two columns of fans 160 and between the columns of fans 160 and the side wall panel 180 of the chassis 100. In the third example, as shown in FIG. 3C, a position of an air vent 170 on the backplane 130 may be changed accordingly. For example, the air vent 170 is provided at a position which corresponds to a fan 160, such as directly opposite to the fan 160, so as to improve cooling efficiency. A connection slot 140 of the network board 110 may be installed at a position which is on the backplane 130 and corresponds to the first gap 200, so as to facilitate wiring of the high-rate cable 150, through the first gap 200, between the connection slot 140 of the network board 110 and a connection slot 140 (indicated by dashed lines in FIG. 3C) of the service board 120 or another network board 110. In the solution represented in the third example, because the high-rate cable 150 can pass through the first gap 200 between the fans 160 and pass through the first gap 200 between the fans 160 and the side wall panel 180 of the chassis 100, there is relatively sufficient wiring space for the high-rate cable 150, thereby improving density and capacity of wiring between the service board and the network board. Here, it should be noted that the third example is only exemplary description, and a person skilled in the art can, according to a specific requirement, for example, arrange the fans in a form of three columns, with the first gap 200 formed between two adjacent columns of fans among the three columns of fans, and a first gap 200 formed between two columns of fans on two sides and adjacent side walls of the chassis, respectively.

Figure 4A:
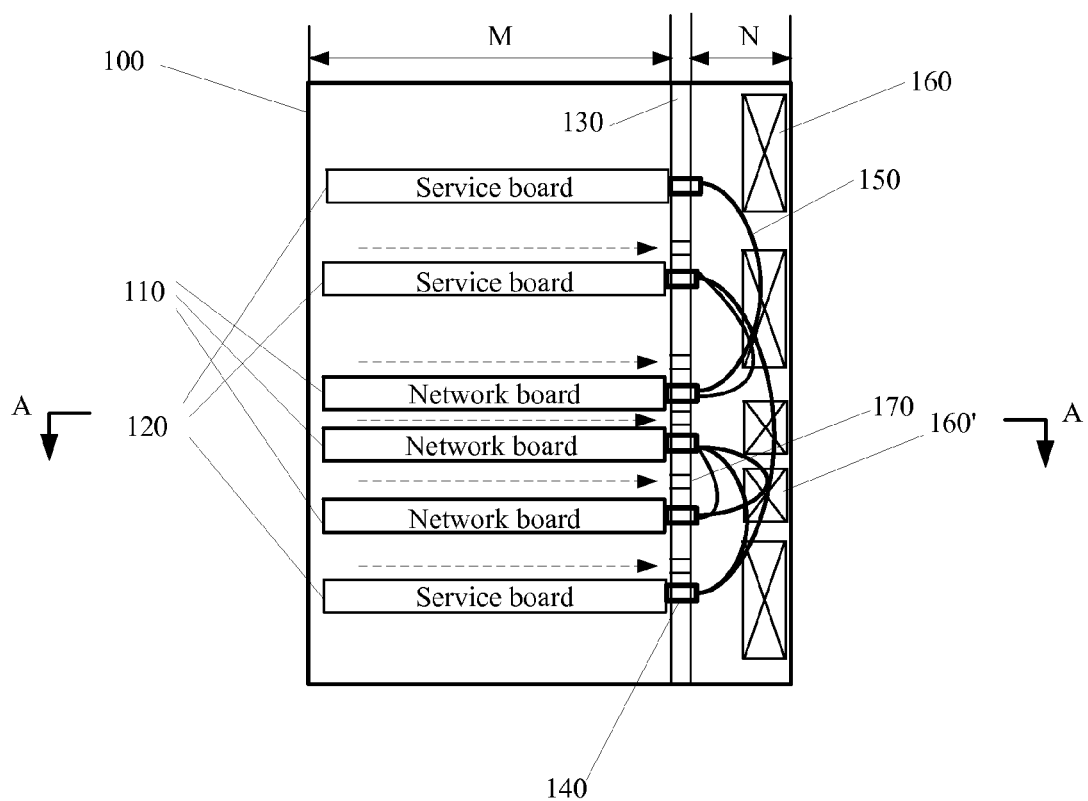
FIG. 4A is a schematic side sectional view of a communications device in a fourth example according to an embodiment of the present disclosure.
Figure 4B:
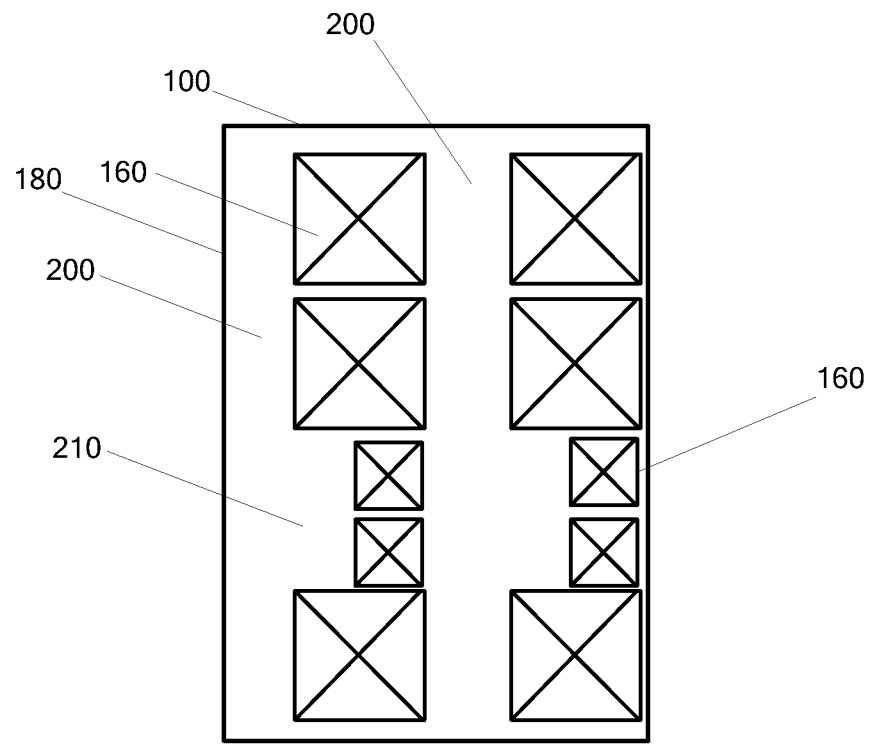
FIG. 4B is a schematic rear sectional view of the communications device in the fourth example according to an embodiment of the present disclosure.
Figure 4C:
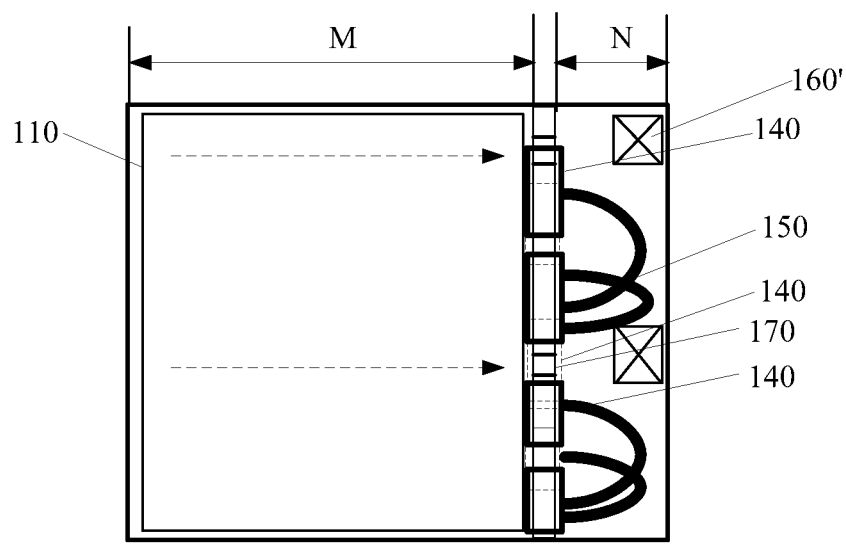
FIG. 4C is a schematic top view of the communications device in the fourth example according to an embodiment of the present disclosure.

The following further describes in detail an improved solution according to an embodiment of the present disclosure with reference to FIG. 4A to FIG. 4C.

FIG. 4A is a schematic side sectional view of a communications device in a fourth example according to an embodiment of the present disclosure. FIG. 4B is a schematic rear sectional view of the communications device in the fourth example according to an embodiment of the present disclosure. FIG. 4C is a schematic top view of the communications device in the fourth example according to an embodiment of the present disclosure, and FIG. 4C is a sectional view of a section A-A shown in FIG. 4A.

The fourth example is an alternative solution of the third example. As shown in FIG. 4A, a communications device 10 in the fourth example includes a chassis 100, a network board 110, a service board 120, a backplane 130, and a high-rate cable 150, where the chassis 100 is configured to house the network board 110, the service board 120, the backplane 130, and the high-rate cable 150. The fourth example differs from the third example in that, as shown in FIG. 4B, widths of a part of fans 160' are smaller than those of the other fans 160 among the two columns of fans 160, so that a widened part 210 is formed in the first gap 200 and at a position at which the widths of the fans 160' decrease. For example, the widened part 210 is formed roughly in a middle part of the two columns of fans 160 along a vertical direction. In this case, as shown in FIG. 4A, the network board 110 is connected, from the front side of the chassis 100, to a position which is on the backplane 130 and corresponds to the widened part 210 of the first gap 200. In this case, because the network board 110 is installed at the position which corresponds to the widened part 210, multiple connection slots 140 can be installed for the network board 110, or a widened connection slot 140 can be installed, so as to further improve the wiring density of the system and facilitate further improvement of transmission efficiency. The high-rate cable may be wired in the first gap 200 and in the widened part 210 of the first gap 200. In this way, wiring space is effectively utilized in a case of ensuring heat dissipation capability of the network board, so as to further improve the wiring density of the system. In the embodiment of the fourth example, an air vent 170 may be provided at a position on the backplane 130, where the position corresponds to the widened part 210 and is opposite to the fans 160', so as to dissipate heat of the network board 110.

According to the alternative solution, the widened part may also be provided, depending on a requirement, at positions close to a top and a bottom of the chassis 100 along the vertical direction.

Figure 5A:
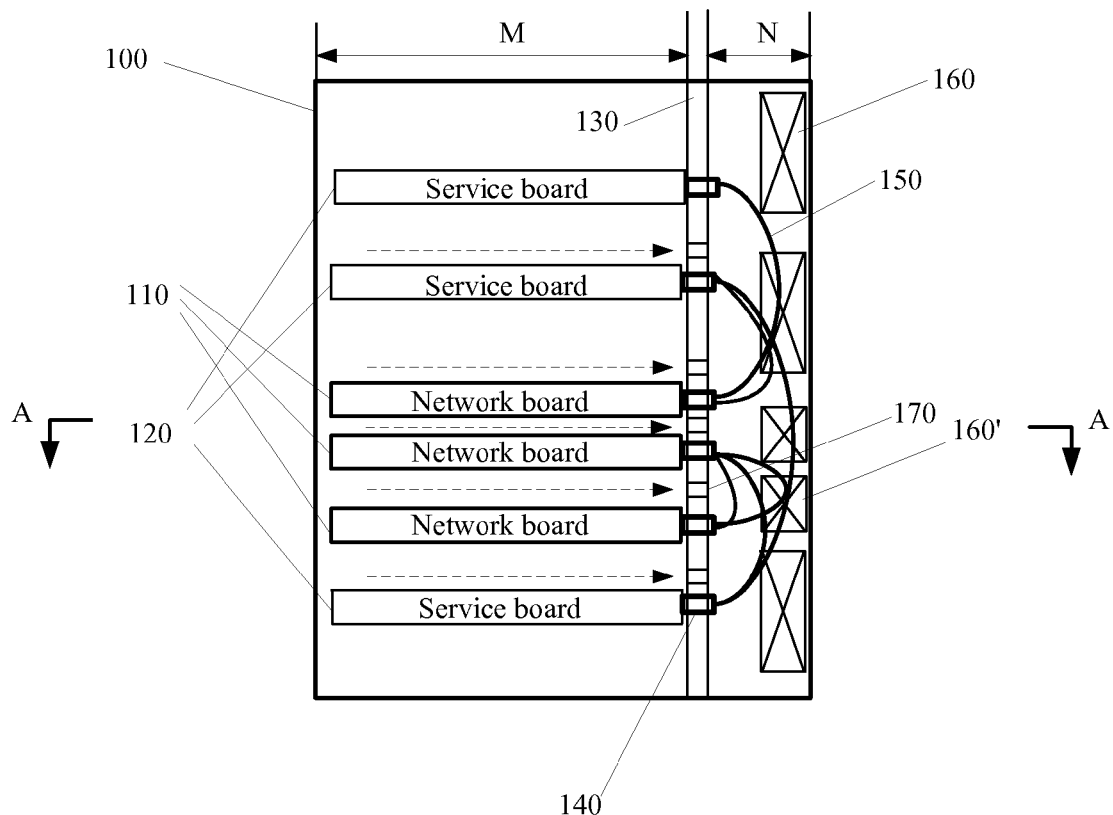
FIG. 5A is a schematic side sectional view of a communications device in a fifth example according to an embodiment of the present disclosure.
Figure 5B:
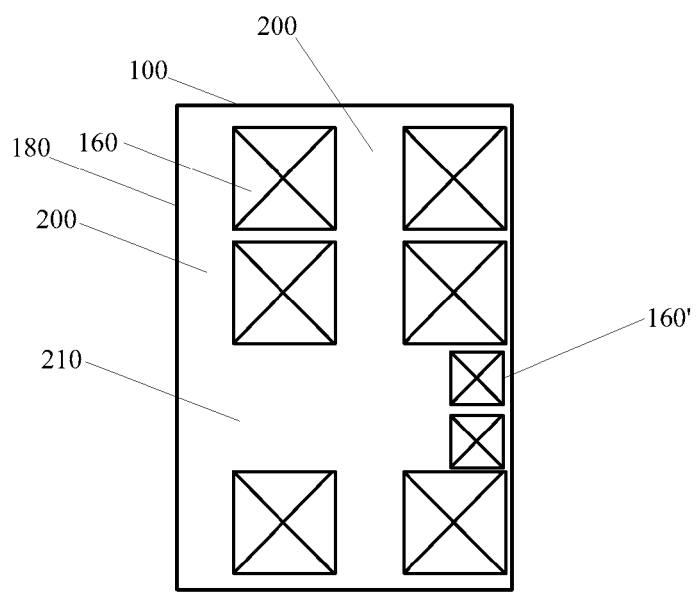
FIG. 5B is a schematic rear sectional view of the communications device in the fifth example according to an embodiment of the present disclosure.
Figure 5C:
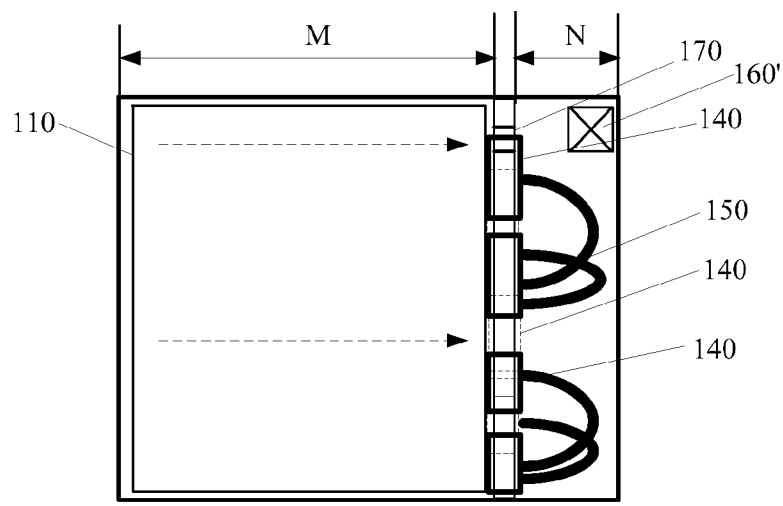
FIG. 5C is a schematic top view of the communications device in the fifth example according to an embodiment of the present disclosure.

The following further describes in detail an improved solution according to an embodiment of the present disclosure with reference to FIG. 5A to FIG. 5C.

FIG. 5A is a schematic side sectional view of a communications device in a fifth example according to an embodiment of the present disclosure. FIG. 5B is a schematic rear sectional view of the communications device in the fifth example according to an embodiment of the present disclosure. FIG. 5C is a schematic top view of the communications device in the fifth example according to an embodiment of the present disclosure, and FIG. 5C is a sectional view of a section A-A shown in FIG. 5A.

The fifth example is an alternative solution of the fourth example. As shown in FIG. 5A, a communications device 10 in the fourth example includes a chassis 100, a network board 110, a service board 120, a backplane 130, and a high-rate cable 150, where the chassis 100 is configured to house the network board 110, the service board 120, the backplane 130, and the high-rate cable 150. The fifth example differs from the fourth example in that: the fans 160' at a part of the widened parts 210 may be canceled, so as to further expand widths of the widened parts 210. In this way, higher wiring density is implemented, wiring space for the high-rate cable 150 is further enlarged, and the wiring space is effectively utilized in a case of ensuring the heat dissipation capability of the network board, so as to further improve the wiring density of the system.

According to the alternative solution in the fifth example, the fans 160' at all widened parts 210 may also be canceled, and then the widened parts penetrate through the left and right sides of the chassis 100 to form a second gap in a horizontal direction. For example, when the widened parts 210 are provided roughly in a middle part of the chassis along the vertical direction on the rear side of the chassis, the second gap is formed in the middle part of the chassis in the horizontal direction.

Figure 6A:
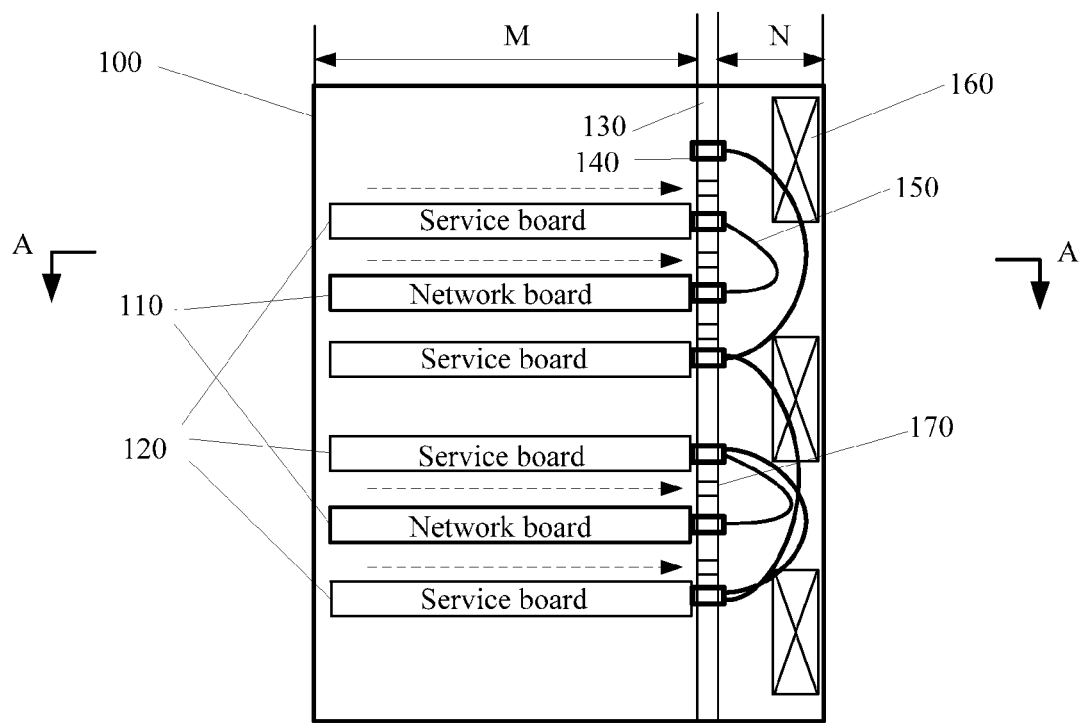
FIG. 6A is a schematic side sectional view of a communications device in a sixth example according to an embodiment of the present disclosure.
Figure 6B:
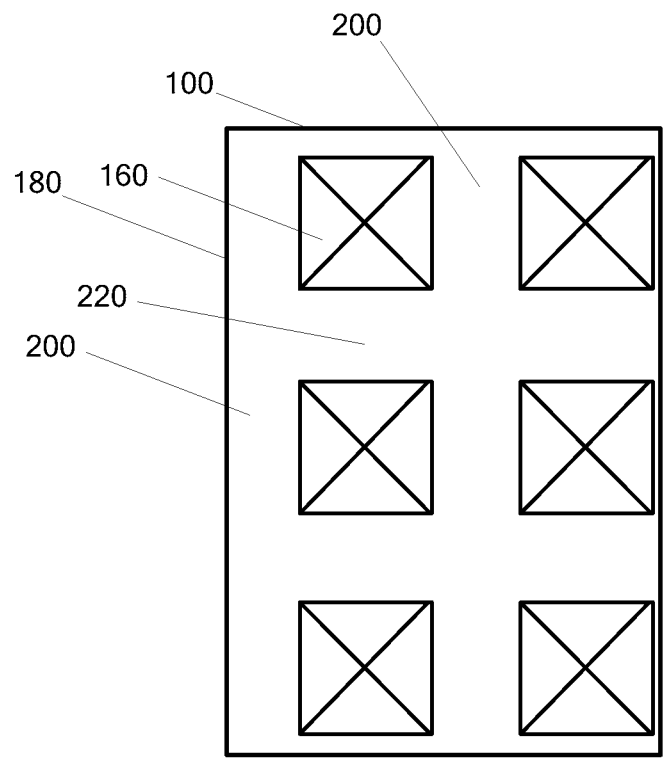
FIG. 6B is a schematic rear sectional view of the communications device in the sixth example according to an embodiment of the present disclosure.
Figure 6C:
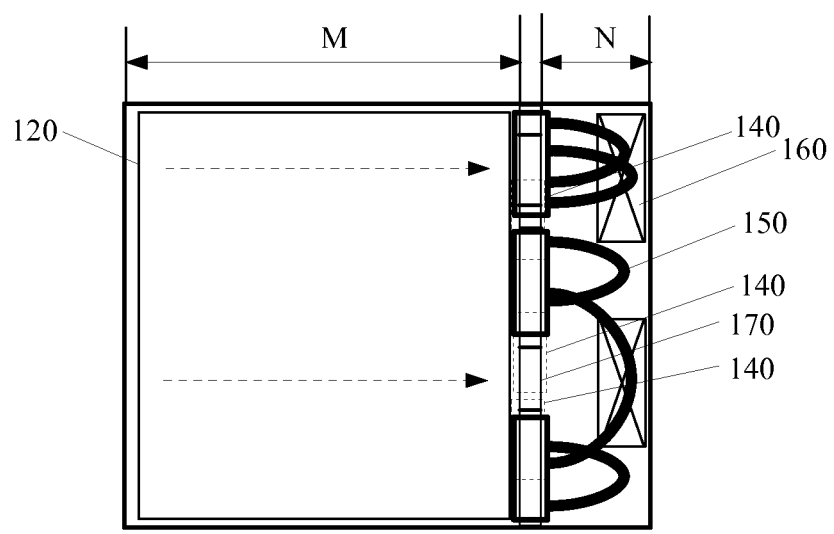
FIG. 6C is a schematic top view of the communications device in the sixth example according to an embodiment of the present disclosure.

The following further describes in detail an improved solution according to an embodiment of the present disclosure with reference to FIG. 6A to FIG. 6C.

FIG. 6A is a schematic side sectional view of a communications device in a sixth example according to an embodiment of the present disclosure. FIG. 6B is a schematic rear sectional view of the communications device in the sixth example according to an embodiment of the present disclosure. FIG. 6C is a schematic top view of the communications device in the sixth example according to an embodiment of the present disclosure, and FIG. 6C is a sectional view of a section A-A shown in FIG. 6A.

The sixth example is an alternative solution of the second example. As shown in FIG. 6A, a communications device 10 in the sixth example includes a chassis 100, a network board 110, a service board 120, a backplane 130, and a high-rate cable 150, where the chassis 100 is configured to house the network board 110, the service board 120, the backplane 130, and the high-rate cable 150. The sixth example differs from the second example in that, in addition to the first gap 200 formed along the vertical direction between the multiple fans 160 in the array form, a second gap 220 is also formed along the horizontal direction between fans 160 that are vertically adjacent to each other, and the high-rate cable 150 connected between the network board 110 and the service board 120 passes through the first gap 200 and the second gap 220, as shown in FIG. 6C. In this case, as shown in FIG. 6A, the network board 110 is connected, from the front side of the chassis 100, to a position which is on the backplane 130 and corresponds to the second gap 220. In this case, because the network board 110 is installed at the position which corresponds to the second gap 220, multiple connection slots 140 can be installed for the network board 110, or a widened connection slot 140 can be installed, so as to further improve the wiring density of the system and facilitate further improvement of transmission efficiency. The high-rate cable can be wired in the first gap 200 and in the second gap 220. In this way, wiring space is effectively utilized while heat dissipation capability of the network board and heat dissipation capability of the service board are ensured, so as to further improve the wiring density of the system.

According to the embodiments of the present disclosure, space used for wiring a high-rate cable is formed through specially designed fan layout, which on one hand improves utilization of space inside a communications device chassis, and on the other hand improves heat dissipation efficiency of a communications device. According to the embodiments of the present disclosure, a front-to-back straight air duct is used, and air enters from a front side of a network board and a front side of a service board, and arrives at a fan after passing through an air vent on a backplane. In this way, a system has small wind resistance and high heat dissipation efficiency, and does not require an extra cooling air duct, thereby improving space utilization and integration of the system. The fan, a first gap, and/or a second gap are all located on a rear side of the backplane. The fan and a cable are spatially reused, thereby further improving the space utilization and the integration of the system.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the appended claims.

What is claimed is:

1. A heat dissipation system for a communications device, wherein the communications device comprises a chassis, a network board, a service board, a backplane, and a high-rate cable; wherein the chassis is configured to house the network board, the service board, the backplane, and the high-rate cable; wherein the backplane is vertically inserted in a middle part or a middle rear part of the chassis, and parallel to a front side of the chassis; wherein the service board and the network board are parallel and are connected to a front side of the backplane; and wherein the high-rate cable is connected between the network board and the service board on a rear side of the backplane; the heat dissipation system comprising:
   multiple fans installed in an array form on a rear side of the chassis; and
   an air vent that penetrates through the backplane;
   wherein a first gap is formed along a vertical direction between the multiple fans, and the high-rate cable connected between the network board and the service board passes through the first gap;
   wherein the multiple fans are installed in a form of two columns of fans, and the first gap is provided between the two columns of fans;
   wherein a second gap is formed along a horizontal direction between the multiple fans, and the high-rate cable connected between the network board and the service board passes through the second gap.

2. The heat dissipation system according to claim 1, wherein the first gap is further provided between the two columns of fans and a side wall of the chassis.

3. The heat dissipation system according to claim 1, wherein widths of a part of the multiple fans are smaller than those of other fans of the multiple fans, so that a widened part is formed in the first gap at a position at which the widths of the fans decrease, and the network board is connected, from the front side of the chassis, to a position which is on the backplane and corresponds to the widened part of the first gap.

4. The heat dissipation system according to claim 1, wherein the second gap is provided in a middle part of the rear side of the chassis, and the network board is connected, from the front side of the chassis, to a position which is on the backplane and corresponds to the second gap.

5. The heat dissipation system according to claim 4, wherein a small-sized fan with a width smaller than those of the fans is installed in the second gap.

6. The heat dissipation system according to claim 1, wherein the multiple fans are installed in a form of two columns of fans, the second gap is provided between fans that are vertically adjacent to each other among the two columns of fans, and the network board is connected, from the front side of the chassis, to a position which is on the backplane and corresponds to the second gap.

7. The heat dissipation system according to claim 1, wherein the air vent is provided at a position which is on the backplane and is directly opposite to the fans.

8. A communications device, comprising:
   a chassis;
   a network board;
   a service board;
   a backplane, vertically inserted in a middle part or a middle rear part of the chassis, and parallel to a front side of the chassis;

a high-rate cable connected between the network board and the service board on a rear side of the backplane; and a heat dissipation system, comprising multiple fans installed in an array form on a rear side of the chassis, and an air vent that penetrates through the backplane;

wherein the chassis is configured to house the network board, the service board, the backplane, and the high-rate cable;

wherein the service board and the network board are parallel and are connected to a front side of the backplane;

wherein a first gap is formed along a vertical direction between the multiple fans, and the high-rate cable connected between the network board and the service board passes through the first gap;

wherein the multiple fans are installed in a form of two columns of fans, and the first gap is provided between the two columns of fans; and wherein a second gap is formed along a horizontal direction between the multiple fans, and the high-rate cable connected between the network board and the service board passes through the second gap.

9. The communications device according to claim 8, wherein the first gap is further provided between the columns of fans and a side wall of the chassis.

10. The communications device according to claim 8, wherein widths of a part of the multiple fans are smaller than those of other fans of the multiple fans, so that a widened part is formed in the first gap at a position at which the widths of the fans decrease, and the network board is connected, from the front side of the chassis, to a position which is on the backplane and corresponds to the widened part of the first gap.

11. The communications device according to claim 8, wherein the second gap is provided in a middle part of the rear side of the chassis, and the network board is connected, from the front side of the chassis, to a position which is on the backplane and corresponds to the second gap.

12. The communications device according to claim 11, wherein a small-sized fan with a width smaller than those of the fans is installed in the second gap.

13. The communications device according to claim 8, wherein the multiple fans are installed in a form of two columns of fans, the second gap is provided between fans that are vertically adjacent to each other among the two columns of fans, and the network board is connected, from the front side of the chassis, to a position which is on the backplane and corresponds to the second gap.

14. The communications device according to claim 8, wherein the air vent is provided at a position which is on the backplane and is directly opposite to the fans.

15. A heat dissipation system for a communications device, wherein the communications device comprises a chassis, a network board, a service board, a backplane, and a high-rate cable; wherein the chassis is configured to house the network board, the service board, the backplane, and the high-rate cable; wherein the backplane is vertically inserted in a middle part or a middle rear part of the chassis, and parallel to a front side of the chassis; wherein the service board and the network board are parallel and are connected to a front side of the backplane; and wherein the high-rate cable is connected between the network board and the service board on a rear side of the backplane; the heat dissipation system comprising:

multiple fans installed in an array form on a rear side of the chassis; and an air vent that penetrates through the backplane;

wherein a gap is formed along a vertical direction between the multiple fans, and the high-rate cable connected between the network board and the service board passes through the gap;

wherein the multiple fans are installed in a form of two columns of fans, and the gap is provided between the two columns of fans; and wherein widths of a part of the multiple fans are smaller than those of other fans of the multiple fans, so that a widened part is formed in the gap at a position at which the widths of the fans decrease, and the network board is connected, from the front side of the chassis, to a position which is on the backplane and corresponds to the widened part of the gap.

16. A communications device, comprising:

a chassis;

a network board;

a service board;

a backplane, vertically inserted in a middle part or a middle rear part of the chassis, and parallel to a front side of the chassis;

a high-rate cable connected between the network board and the service board on a rear side of the backplane; and a heat dissipation system, comprising multiple fans installed in an array form on a rear side of the chassis, and an air vent that penetrates through the backplane;

wherein the chassis is configured to house the network board, the service board, the backplane, and the high-rate cable;

wherein the service board and the network board are parallel and are connected to a front side of the backplane;

wherein a gap is formed along a vertical direction between the multiple fans, and the high-rate cable connected between the network board and the service board passes through the gap;

wherein the multiple fans are installed in a form of two columns of fans, and the gap is provided between the two columns of fans; and wherein widths of a part of the multiple fans are smaller than those of other fans of the multiple fans, so that a widened part is formed in the gap at a position at which the widths of the fans decrease, and the network board is connected, from the front side of the chassis, to a position which is on the backplane and corresponds to the widened part of the gap.

\* \* \* \* \*